(12) United States Patent
Wu et al.

(10) Patent No.: US 12,347,739 B2
(45) Date of Patent: Jul. 1, 2025

(54) PACKAGE STRUCTURE

(71) Applicant: Taiwan Semiconductor Manufacturing Company, Ltd., Hsinchu (TW)

(72) Inventors: Chih-Wei Wu, Yilan County (TW); Ying-Ching Shih, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 503 days.

(21) Appl. No.: 17/896,097

(22) Filed: Aug. 26, 2022

(65) Prior Publication Data
US 2024/0071855 A1    Feb. 29, 2024

(51) Int. Cl.
*H01L 23/367*    (2006.01)
*H01L 23/00*    (2006.01)
(Continued)

(52) U.S. Cl.
CPC ........ *H01L 23/367* (2013.01); *H01L 23/3128* (2013.01); *H01L 23/3157* (2013.01);
(Continued)

(58) Field of Classification Search
CPC ............... H01L 23/367; H01L 23/3128; H01L 23/3157; H01L 23/49811; H01L 23/5383;
(Continued)

(56) References Cited

U.S. PATENT DOCUMENTS 9,000,584 B2    4/2015    Lin et al.
9,048,222 B2    6/2015    Hung et al.
(Continued)

FOREIGN PATENT DOCUMENTS

TW    201503315    1/2015

OTHER PUBLICATIONS

"Office Action of Taiwan Counterpart Application", issued on Dec. 28, 2023, p. 1-p. 7.

*Primary Examiner* — Douglas W Owens
(74) *Attorney, Agent, or Firm* — JCIPRNET

(57) ABSTRACT

A package structure including a semiconductor die, a redistribution circuit structure, a backside dielectric layer, conductive terminals, an electronic device, and an underfill is provided. The semiconductor die laterally encapsulated by an insulating encapsulation. The redistribution circuit structure is disposed on the semiconductor die and the insulating encapsulation. The redistribution circuit structure includes redistribution conductive layers and thermal enhancement structures electrically insulated from the redistribution conductive layers, and the thermal enhancement structures are thermally coupled to the semiconductor die. The backside dielectric layer is disposed on the redistribution circuit structure. The conductive terminals penetrate through the backside dielectric layer. The electronic device is disposed over the backside dielectric layer and electrically connected to the redistribution circuit structure through the conductive terminals. The underfill is disposed between the backside dielectric layer and the electronic device, wherein the underfill is thermally coupled to the thermal enhancement structures.

20 Claims, 18 Drawing Sheets

(51) Int. Cl.
   *H01L 23/31* (2006.01)
   *H01L 23/498* (2006.01)
   *H01L 23/538* (2006.01)
   *H01L 25/18* (2023.01)

(52) U.S. Cl.
   CPC .... *H01L 23/49811* (2013.01); *H01L 23/5383* (2013.01); *H01L 23/5389* (2013.01); *H01L 24/16* (2013.01); *H01L 24/32* (2013.01); *H01L 24/73* (2013.01); *H01L 25/18* (2013.01); H01L 24/05 (2013.01); H01L 24/13 (2013.01); H01L 24/29 (2013.01); H01L 2224/05624 (2013.01); H01L 2224/05647 (2013.01); H01L 2224/13147 (2013.01); H01L 2224/16227 (2013.01); H01L 2224/2929 (2013.01); H01L 2224/29298 (2013.01); H01L 2224/32225 (2013.01); H01L 2224/73204 (2013.01)

(58) Field of Classification Search
   CPC ..... H01L 23/5389; H01L 24/16; H01L 24/32; H01L 24/73; H01L 25/18; H01L 24/05; H01L 24/13; H01L 24/29; H01L 2224/16227; H01L 2224/29298; H01L 2224/32225; H01L 2224/73204; H01L 23/3171; H01L 21/486; H01L 2225/1023; H01L 2225/1035; H01L 2225/1041; H01L 2225/1058; H01L 21/6835; H01L 23/49816; H01L 23/5384; H01L 23/5386; H01L 24/83; H01L 25/105
   See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 11,362,037 | B2 * | 6/2022 | Chiu ............... H01L 23/5389 |
| 11,532,531 | B2 * | 12/2022 | Wang ............ H01L 23/49811 |
| 2020/0013707 | A1 | 1/2020 | Jeng et al. |
| 2020/0105544 | A1 * | 4/2020 | Tsai ................ H01L 21/4853 |
| 2020/0118990 | A1 * | 4/2020 | Xu .................... H01L 23/5383 |
| 2022/0028842 | A1 * | 1/2022 | Chang ............. H01L 23/3135 |
| 2022/0189884 | A1 * | 6/2022 | Chuang ................ H01L 24/83 |
| 2022/0199593 | A1 | 6/2022 | Yang et al. |
| 2023/0089795 | A1 * | 3/2023 | Wang .................... H01L 21/56 |
| 2023/0317585 | A1 * | 10/2023 | Chiang ........... H01L 23/49816 |
| | | | 257/690 |
| 2024/0038626 | A1 * | 2/2024 | Chang ............... H01L 21/4857 |
| 2024/0038649 | A1 * | 2/2024 | Kuo ................. H01L 23/49838 |

\* cited by examiner

PACKAGE STRUCTURE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out packages and package-on-package (PoP) structures having the integrated fan-out package are becoming increasingly popular for their compactness, and the heat dissipation performance of the integrated fan-out packages is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
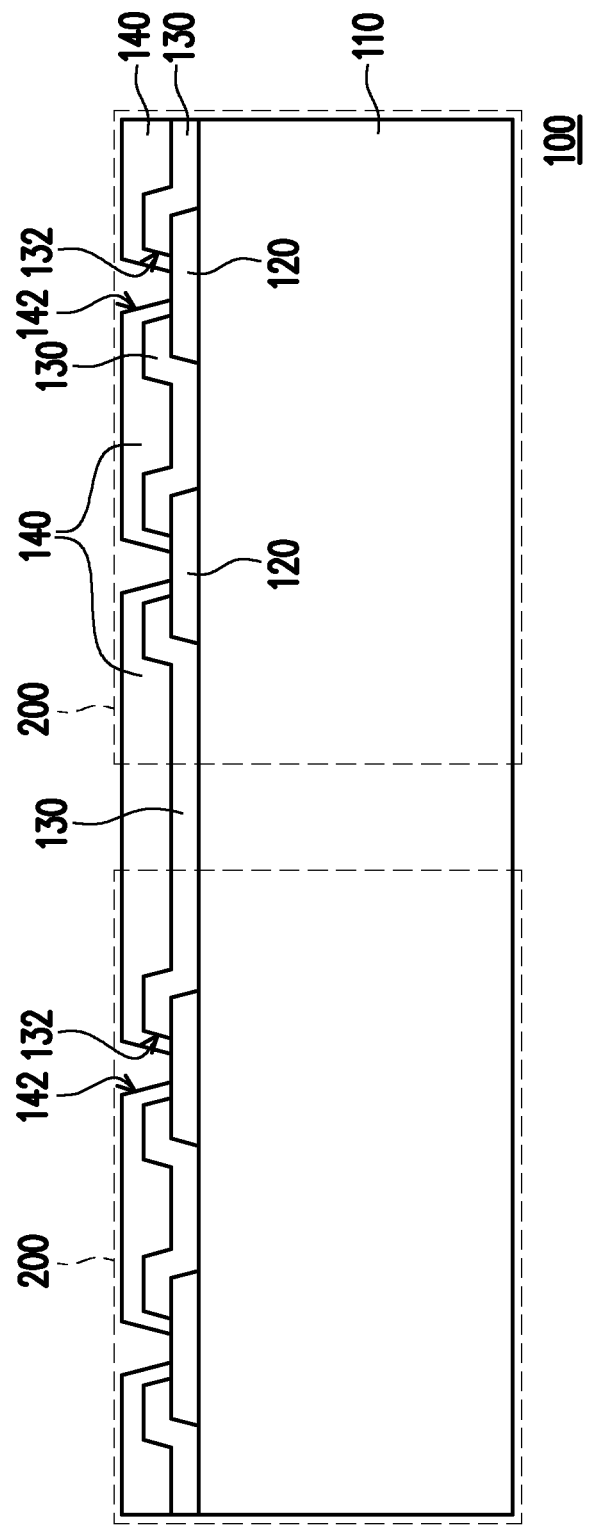
FIGS. 1 through 13 schematically illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 13 schematically illustrate a process flow for fabricating an integrated fan-out package in accordance with some embodiments. FIG. 14 is a cross-sectional view schematically illustrating a package-on-package (PoP) structure in accordance with some embodiments.

Referring to FIG. 1, a semiconductor wafer 100 including a plurality of semiconductor dies 200 arranged in array is provided. Before a wafer dicing process is performed on the semiconductor wafer 100, the semiconductor dies 200 in the semiconductor wafer 100 are connected one another. In some embodiments, the semiconductor wafer 100 includes a semiconductor substrate 110, a plurality of conductive pads 120 formed on the semiconductor substrate 110, and a passivation layer 130. The passivation layer 130 is formed over the semiconductor substrate 110 and includes a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors, or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the semiconductor wafer 100 may optionally include a post-passivation layer 140 formed over the passivation layer 130. The post-passivation layer 140 covers the passivation layer 130 and includes a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
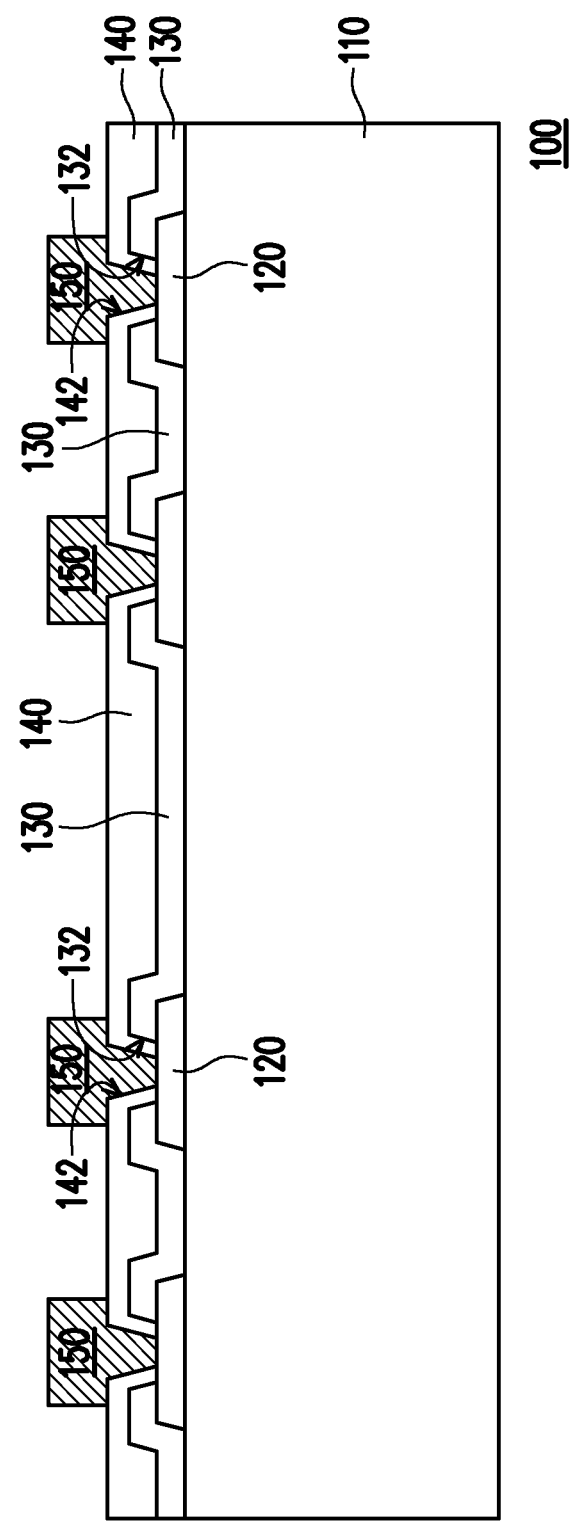

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are located above the conductive pads 120. The semiconductor wafer 100 including the patterned photoresist layer formed thereon is then immersed into a plating solution of a plating bath such that the conductive pillars 150 are plated on the exposed portions of the seed layer that are located above the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the post passivation layer 140 is exposed, for example. In some embodiments, the conductive pillars 150 are plated copper pillars.

Figure 3:
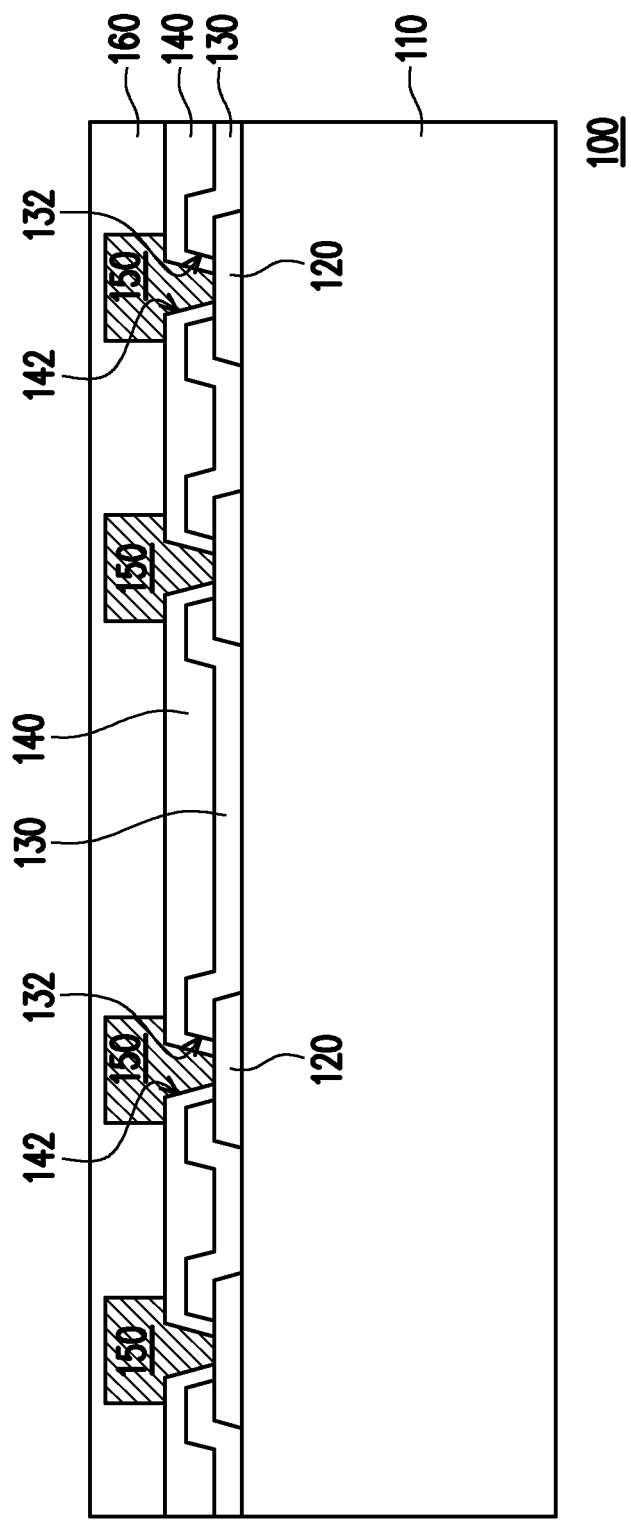

Referring to FIG. 3, after the conductive pillars 150 are formed, a protection layer 160 is formed on the post passivation layer 140 to cover the conductive pillars 150. In some embodiments, the protection layer 160 is a polymer layer having sufficient thickness to encapsulate and protect the conductive pillars 150. In other words, the maximum thickness of the protection layer 160 is greater than the height of the conductive pillars 150. The protection layer 160 may be a polybenzoxazole (PBO) layer, a polyimide (PI) layer or other suitable polymer layer. In some alternative embodiments, the protection layer 160 are made of inorganic materials.

Figure 4:
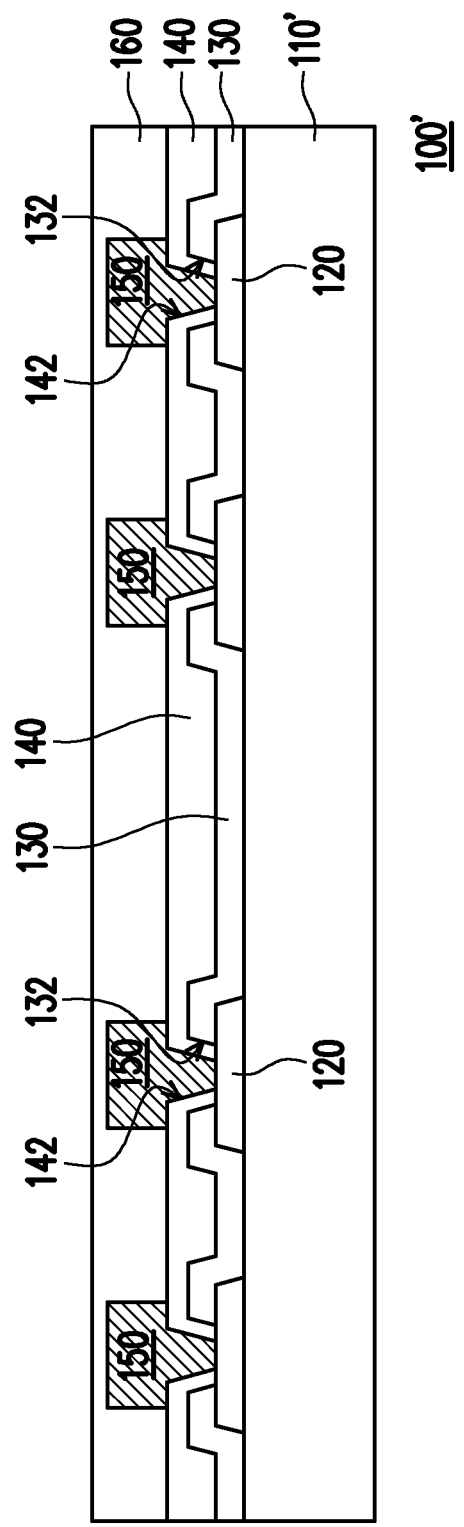

Referring to FIG. 4, a back side grinding process is performed on the rear surface of the semiconductor wafer 100 after the protection layer 160 is formed. During the back side grinding process, the semiconductor substrate 110 is partially removed such that a thinned wafer 100' including a thinned semiconductor substrate 110' is formed. In some embodiments, the back side grinding process of the semiconductor wafer 100 includes a chemical mechanical polishing (CMP) process, a mechanical grinding process or combinations thereof.

Figure 5:
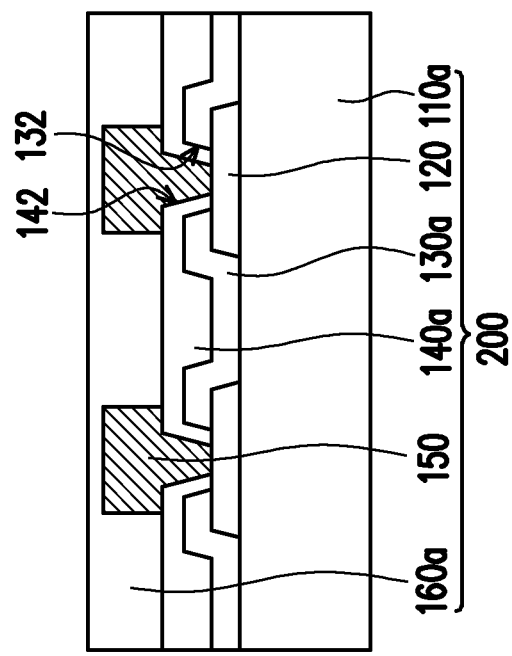
Figure 5:
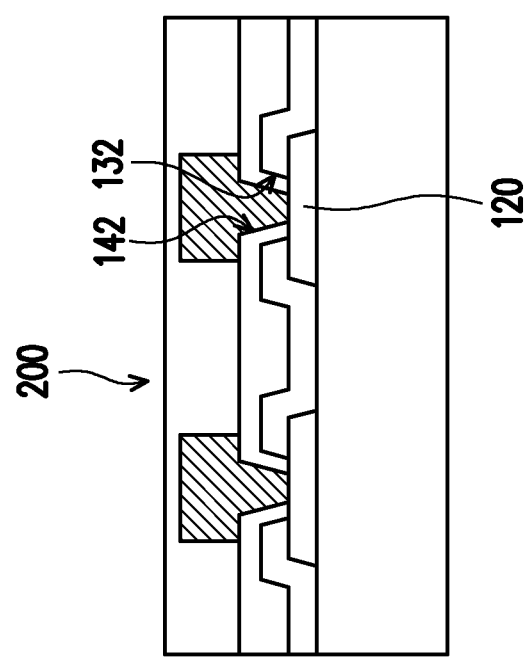

Referring to FIG. 5, after the back side grinding process is performed, a wafer dicing process is performed on the thinned wafer 100' such that the semiconductor dies 200 in the semiconductor wafer 100' are singulated from one another and a plurality of singulated semiconductor dies 200 are obtained. Each of the singulated semiconductor dies 200 may include a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the material and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4, during the back side grinding, the protection layer 160 may protect the conductive pillars 150 of the semiconductor dies 200 from damage by the back side grinding. As shown in FIG. 5, during the wafer dicing processes, the protection layer 160a may protect the conductive pillars 150 of the semiconductor dies 200 from damage by the wafer dicing processes. In addition, the conductive pillars 150 of the semiconductor dies 200 may be protected by the protection layer 160a from being damaged by sequentially performed processes, such as the pick-up and placing process of the semiconductor dies 200, the molding process, and so on.

Figure 6:
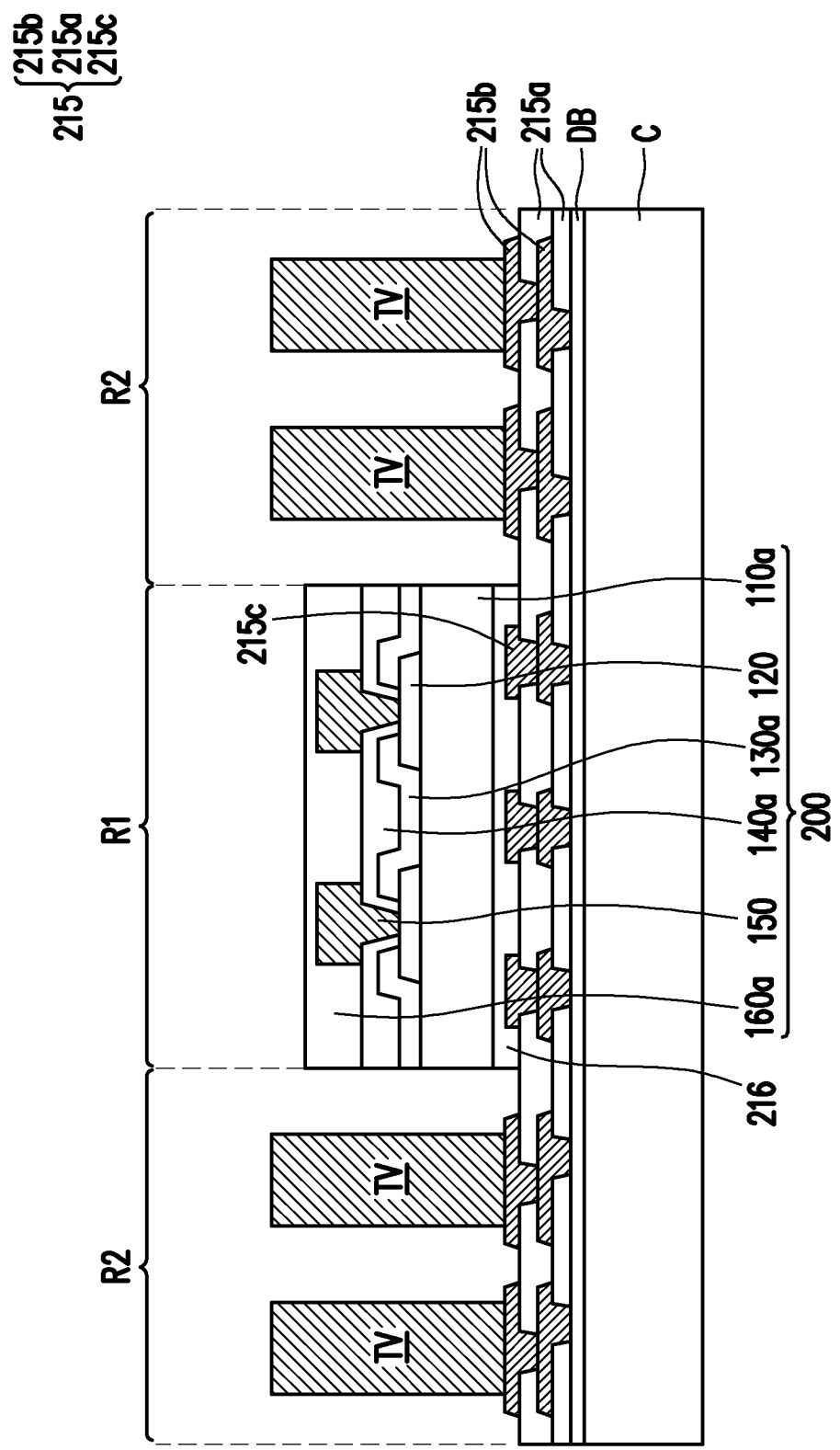

Referring to FIG. 6, after the semiconductor dies 200 are singulated from the thinned wafer 100' (shown in FIG. 4), a carrier C having a de-bonding layer DB and a back-side redistribution circuit structure 215 formed thereon is provided, wherein the de-bonding layer DB is disposed between the carrier C and the back-side redistribution circuit structure 215. In some embodiments, the carrier C is a glass substrate, and the de-bonding layer DB is a light-to-heat conversion (LTHC) release layer formed on the glass substrate. The above-mentioned de-bonding layer DB (i.e., the LTHC release layer) is an adhesive layer whose adhesion decreases while being heated. The back-side redistribution circuit structure 215 formed over the de-bonding layer DB may include a plurality of inter-dielectric layers 215a and a plurality of redistribution conductive layers 215b stacked alternately. The bottommost inter-dielectric layer 215a among the inter-dielectric layers 215a is deposited on the de-bonding layer DB. The bottommost inter-dielectric layer 215a is in contact with the de-bonding layer DB. The rest of the inter-dielectric layer 215a among the inter-dielectric layers 215a as well as the redistribution conductive layers 215b are formed over the bottommost inter-dielectric layer 215a. The number of the layers of the redistribution conductive layers 215b and the number of the layers of the inter-dielectric layer 215a are not limited in the present invention.

The back-side redistribution circuit structure 215 may include a die-bond region R1 and a periphery region R2, wherein the die-bond region R1 may be surrounded by the periphery region R2, and the redistribution conductive layers 215b are distributed in the periphery region R2. In some embodiments, the inter-dielectric layers 215a include polybenzoxazole (PBO) layers, polyimide (PI) layers or other suitable polymer layers, and the redistribution conductive layers 215b includes copper wiring layers or other suitable metallic layers.

Figure 18:
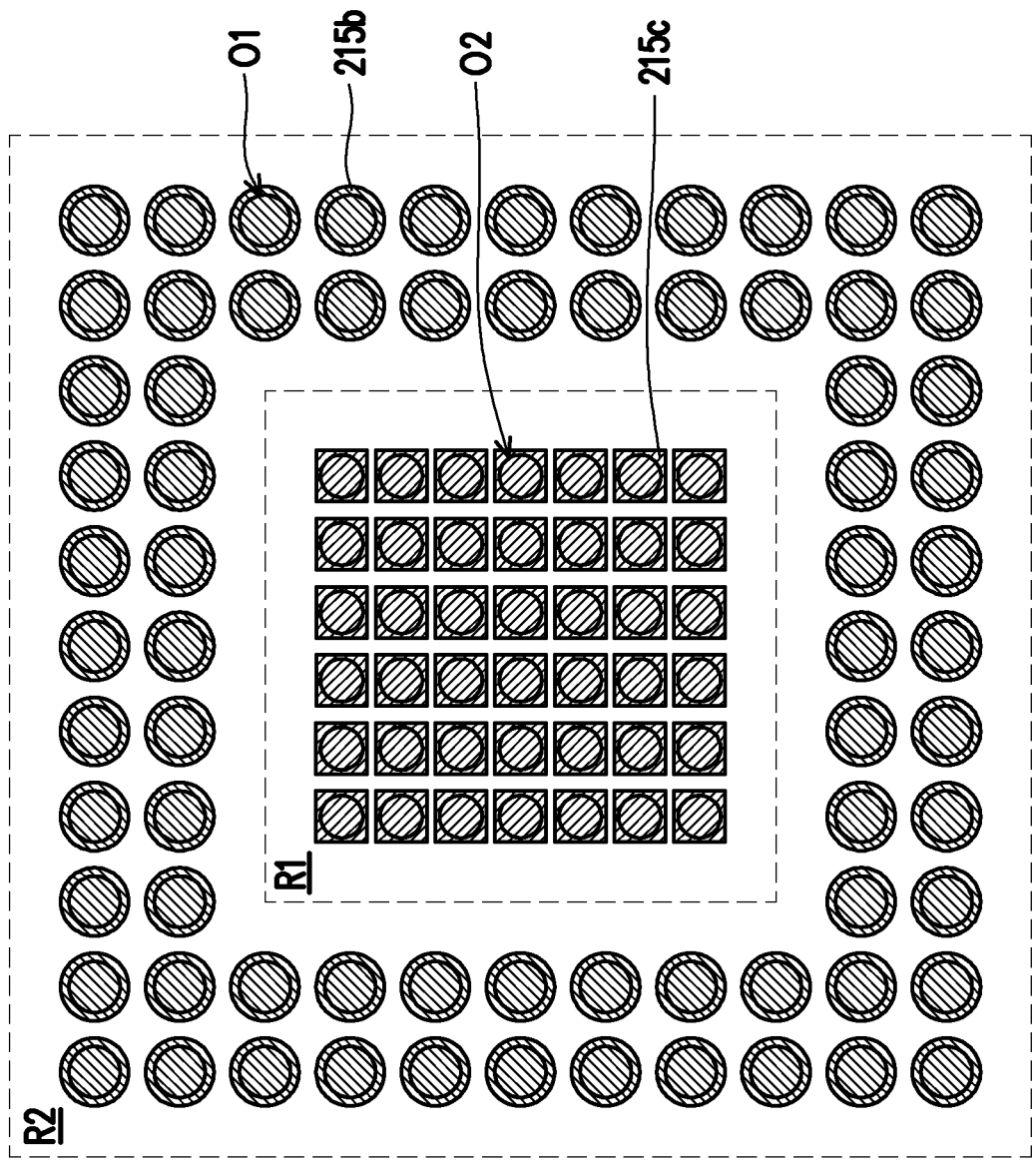
FIG. 18 is a top view schematically illustrating the distribution of the redistribution conductive layers 215b, the thermal enhancement structures 215c as well as the first and second openings O1, O2.

The back-side redistribution circuit structure 215 further includes thermal enhancement structures 215c embedded in the inter-dielectric layers 215a. The thermal enhancement structures 215c are distributed in the die-bond region R1. The thermal enhancement structures 215c distributed above the die-bond region R1 may have circular shaped outer profile when viewing from atop, as shown in FIG. 18. In some embodiments, each thermal enhancement structure among the thermal enhancement structures 215c includes stacked thermal pads and at least one thermal via thermally coupled between the stacked thermal pads. Through the thermal coupling between the thermal pads and the thermal via, the heat generated from the semiconductor dies 200 can be efficiently transferred and dissipated. The above-mentioned thermal coupling is the interrelationship among three primary modes (i.e., conduction, convection and radiation) of heat transfer. The thermal enhancement structures 215c are electrically insulated from the redistribution conductive layers 215b. For example, the thermal enhancement structures 215c are electrically floated.

After the carrier C including the de-bonding layer DB and the back-side redistribution circuit structure 215 formed thereon is provided, a plurality of conductive through vias TV may be formed on the periphery region R2 of the back-side redistribution circuit structure 215. The conductive through vias TV are formed to electrically connected to the redistribution conductive layers 215b of the back-side redistribution circuit structure 215. In some embodiments, the plurality of conductive through vias TV are formed by seed layer sputtering, photoresist coating, photolithography, plating, photoresist stripping process, and seed layer patterning. The conductive through vias TV may be or include copper posts or other suitable metal posts.

As shown in FIG. 6, in some embodiments, one of the semiconductor dies 200 (shown in FIG. 5) including the conductive pads 120, the conductive pillars 150, and a protection layer 160a formed thereon is picked and placed on the die-bond region R1 of the back-side redistribution circuit structure 215. The semiconductor die 200 covers the thermal enhancement structures 215c of the back-side redistribution circuit structure 215. The rear surface of the semiconductor die 200 is thermally coupled to the thermal enhancement structures 215c of the back-side redistribution circuit structure 215. The semiconductor die 200 is attached or adhered with the die-bond region R1 of the back-side redistribution circuit structure 215 through a die attachment film (DAF) 216, an adhesive or the like. In some alternative embodiments, more than one of the semiconductor dies 200 are picked and placed on the die-bond region R1 of the back-side redistribution circuit structure 215, wherein the semiconductor dies 200 placed on the die-bond region R1 of the back-side redistribution circuit structure 215 are arranged in array. In an embodiment where the semiconductor dies 200 placed on the die-bond region R1 of the back-side redistribution circuit structure 215 are arranged in array, the conductive through vias TV are classified into multiple groups. The number of the groups of the conductive through vias TV is corresponding to the number of the semiconductor dies 200.

As shown in FIG. 6, the top surface of the protection layer 160a is lower than the top surfaces of the conductive through vias TV, and the top surface of the protection layer 160a is higher than the top surfaces of the conductive pillars 150. However, the disclosure is not limited thereto. In some alternative embodiments, the top surface of the protection layer 160a is substantially aligned with the top surfaces of the conductive through vias TV, and the top surface of the protection layer 160a is higher than the top surfaces of the conductive pillars 150.

As shown in FIG. 6, the semiconductor die 200 is picked and placed on the back-side redistribution circuit structure 215 after the formation of the conductive through vias TV. However, the disclosure is not limited thereto. In some alternative embodiments, the semiconductor die 200 is picked and placed on the back-side redistribution circuit structure 215 before the formation of the conductive through vias TV.

Figure 7:
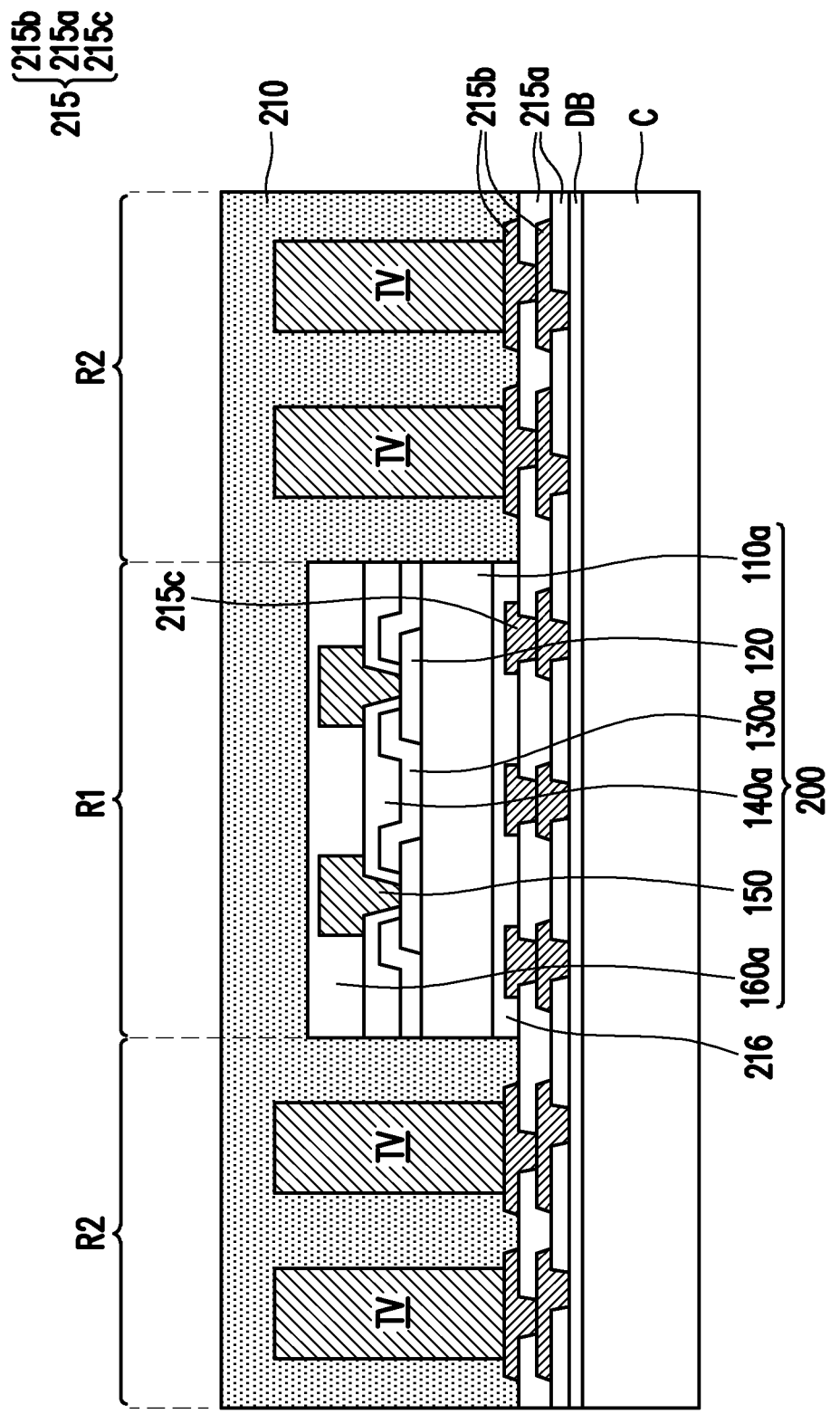

Referring to FIG. 7, an insulating material 210 is formed on the back-side redistribution circuit structure 215 to cover the semiconductor die 200 and the conductive through vias TV. In some embodiments, the insulating material 210 is a molding compound formed by an over-mold process. The conductive pillars 150 and the protection layer 160a of the semiconductor die 200 are covered by the insulating material 210. In other words, the top surface of the insulating material 210 is higher than the top surfaces of the conductive pillars 150 and the protection layer 160a of the semiconductor die 200, such that the conductive pillars 150 and the protection layer 160a of the semiconductor die 200 are not revealed and are well protected by the insulating material 210. In some embodiments, the insulating material 210 includes epoxy or other suitable dielectric materials.

Figure 8:
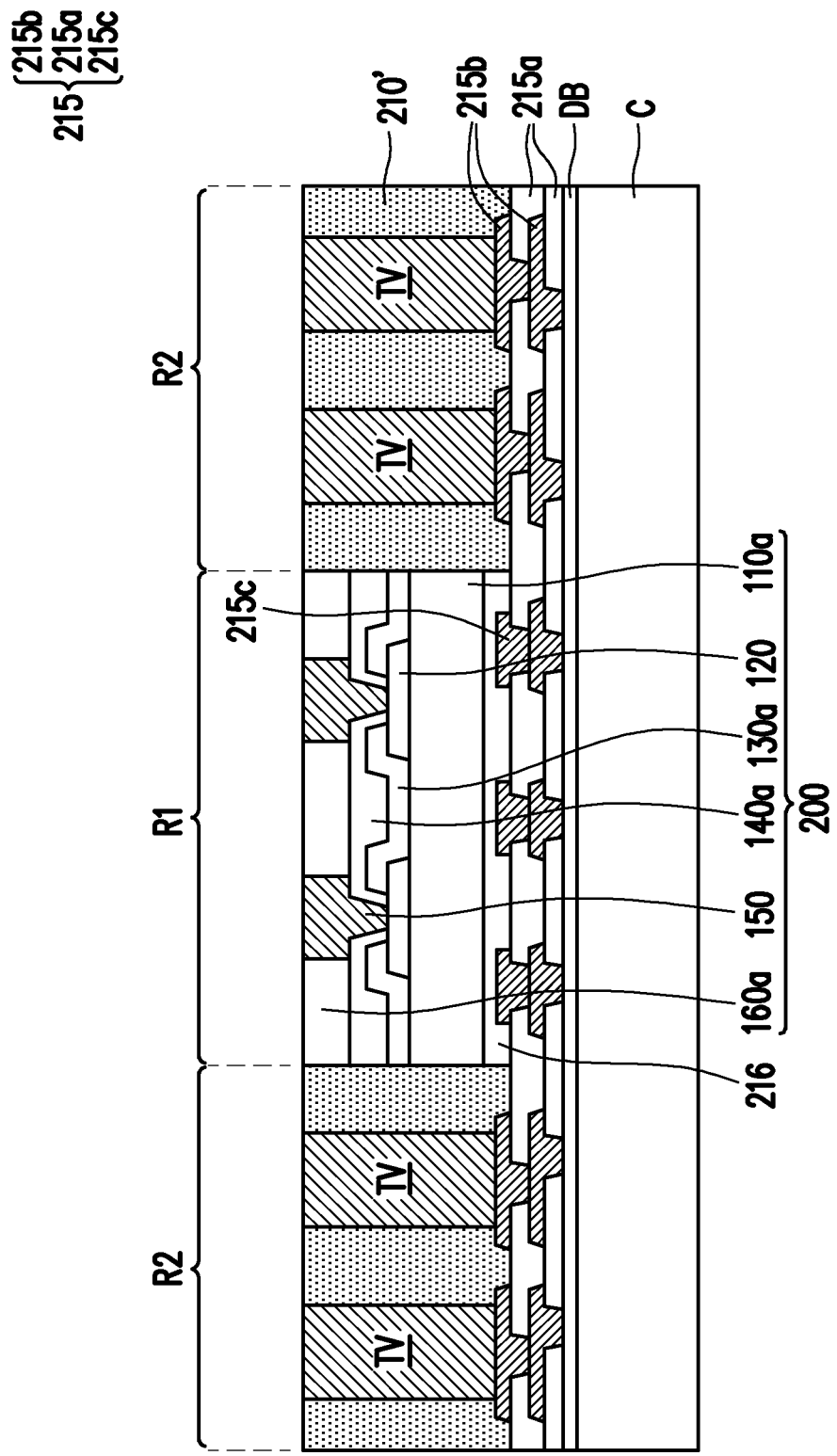

Referring to FIG. 8, the insulating material 210 is then partially removed until the top surfaces of the conductive pillars 150, the top surfaces of the conductive through vias TV, and the top surface of the protection layer 160a are exposed. In some embodiments, the insulating material 210 is partially removed by an etch process, a mechanical grinding process, a chemical mechanical polishing (CMP) process, or combinations thereof. After the insulating material 210 is partially removed, an insulating encapsulation 210' is formed over the back-side redistribution circuit structure 215. The insulating encapsulation 210' laterally encapsulate the semiconductor die 200 and the conductive through vias TV. The semiconductor die 200 is laterally spaced apart from the conductive through vias TV by the insulating encapsulation 210'. During the removal process of the insulating material 210 (shown in FIG. 7), portions of the protection layer 160a are removed to form a protection layer 160a'. In some embodiments, during the removal process of the insulating material 210 and the protection layer 160a (shown in FIG. 7), portions of the conductive through vias TV and portions of the conductive pillars 150 are removed as well.

As shown in FIG. 8, the insulating encapsulation 210' encapsulates and is in contact with the sidewalls of the semiconductor die 200, and the insulating encapsulation 210' is penetrated by the conductive through vias TV. In other words, the semiconductor die 200 and the conductive through vias TV are embedded in the insulating encapsulation 210'. It is noted that the top surfaces of the conductive through vias TV, the top surface of the insulating encapsulation 210', and the top surfaces of the conductive pillars 150 may substantially level with the top surface of the protection layer 160a'.

Figure 9:
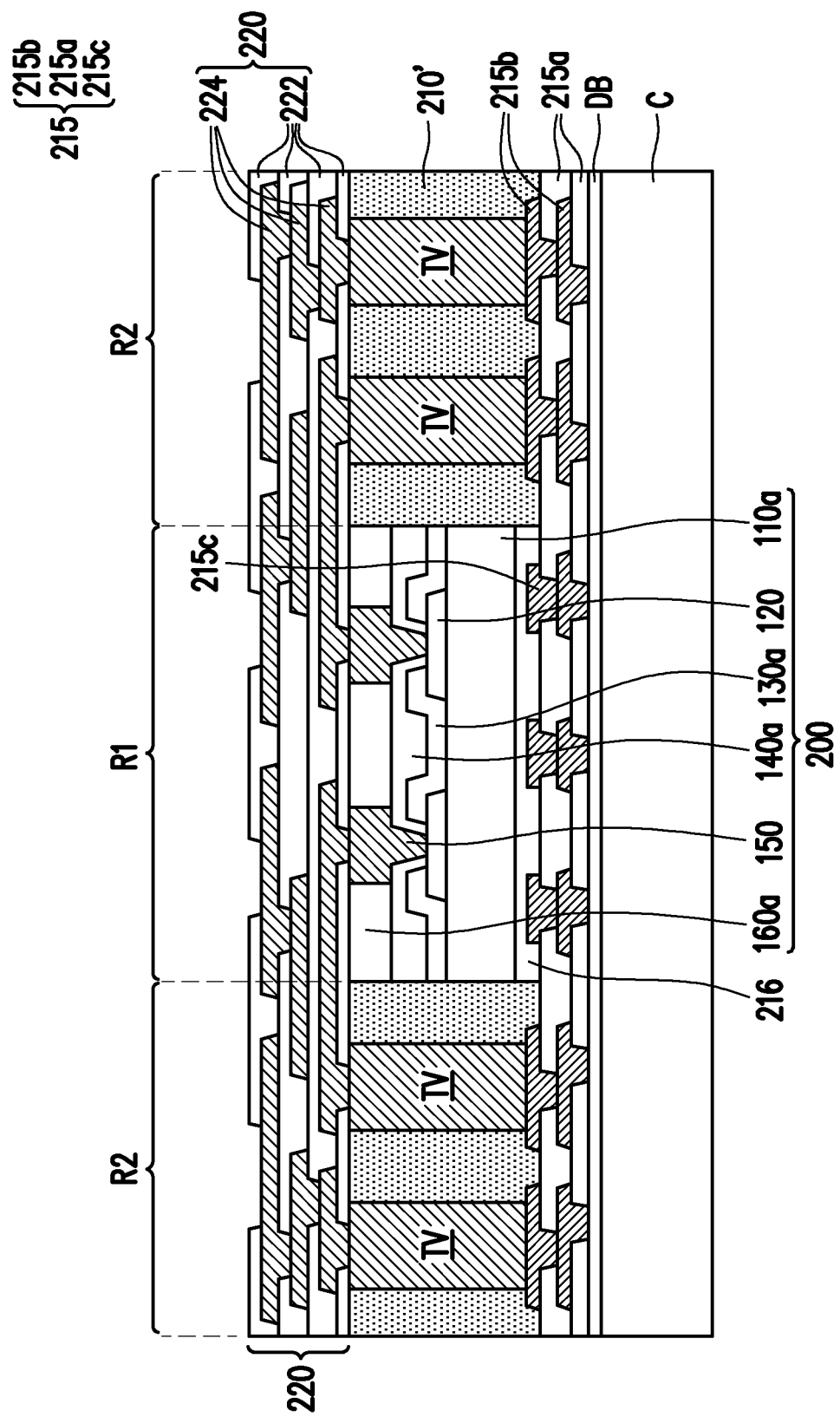

Referring to FIG. 9, after the insulating encapsulation 210' and the protection layer 160a' are formed, a front-side redistribution circuit structure 220 electrically connected to the conductive pillars 150 of the semiconductor die 200 may be formed on the top surfaces of the conductive through vias TV, the top surface of the insulating encapsulation 210', the top surfaces of the conductive pillars 150, and the top surface of the protection layer 160a'. The front-side redistribution circuit structure 220 is fabricated to electrically connect with one or more connectors underneath. Here, the afore-said connectors may be the conductive pillars 150 of the semiconductor die 200 and/or the conductive through vias TV embedded in the insulating encapsulation 210'. The front-side redistribution circuit structure 220 is described in accompany with FIG. 9 in detail.

Referring to FIG. 9, the front-side redistribution circuit structure 220 includes a plurality of inter-dielectric layers 222 and a plurality of redistribution conductive layers 224 stacked alternately, and the redistribution conductive layers 224 are electrically connected to the conductive pillars 150 of the semiconductor die 200 and the conductive through vias TV embedded in the insulating encapsulation 210'. In some embodiments, the top surfaces of the conductive pillars 150 and the top surfaces of the conductive through vias TV are in contact with the front-side redistribution circuit structure 220. The top surfaces of the conductive pillars 150 and the top surfaces of the conductive through vias TV are partially covered by the bottommost inter-dielectric layer 222 among the inter-dielectric layers 222. The conductive pillars 150 and the conductive through vias TV are electrically connected to the bottommost redistribution conductive layer 224 among the redistribution conductive layers 224 through contact openings defined in the bottommost inter-dielectric layer 222. Furthermore, the topmost redistribution conductive layer 224 among the redistribution conductive layers 224 may include a plurality of conductive patterns (e.g., conductive pads) revealed by openings defined in the topmost inter-dielectric layer 222 among the inter-dielectric layers 222. In some embodiments, the inter-dielectric layers 222 includes polybenzoxazole (PBO) layers, polyimide (PI) layers or other suitable polymer layers, and the redistribution conductive layers 224 includes copper wiring layers or other suitable metallic layers.

Figure 10:
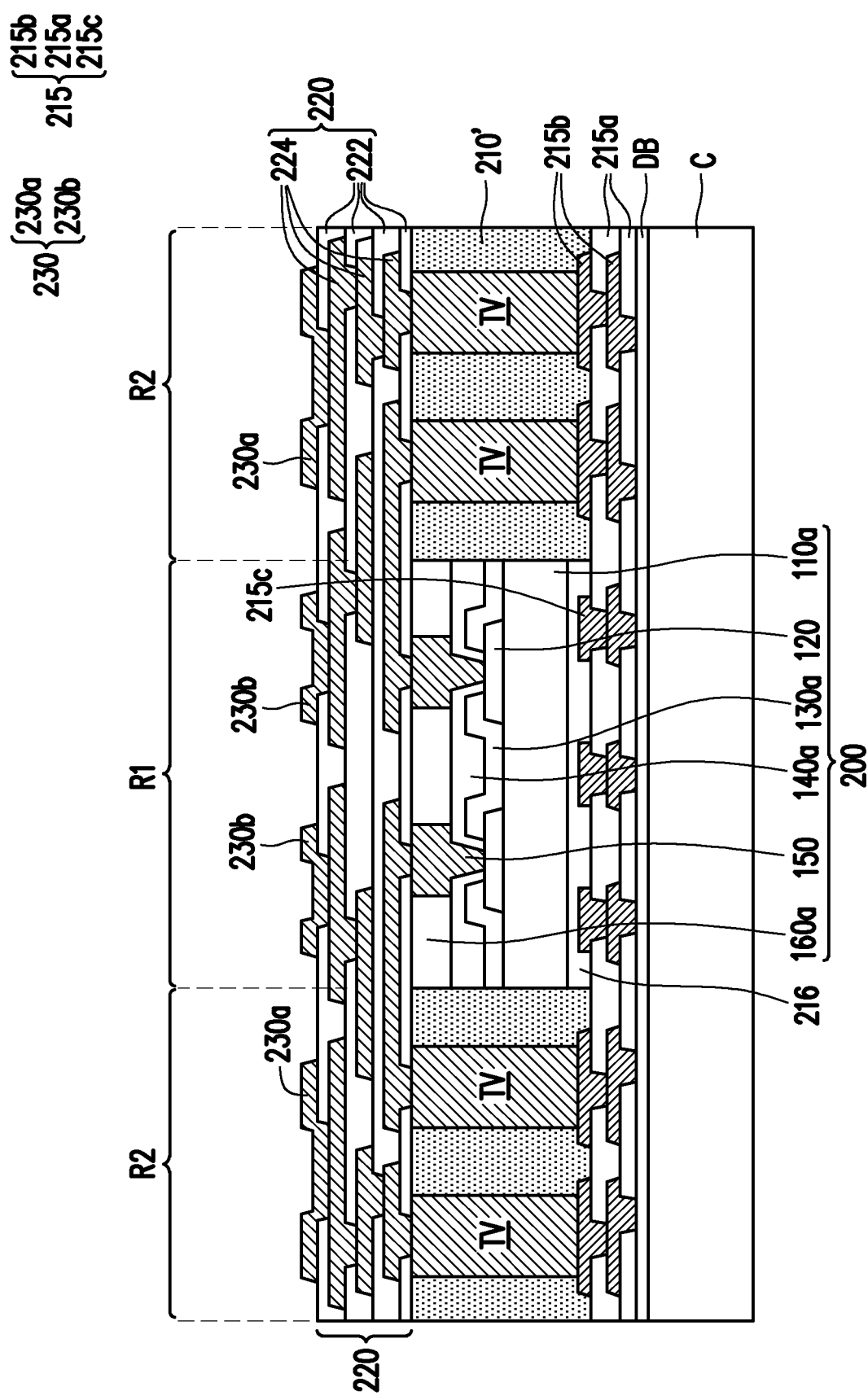

As shown in FIG. 10, after the front-side redistribution circuit structure 220 is formed, a plurality of conductive pads 230 are then formed on the topmost redistribution conductive layer 224 of the front-side redistribution circuit structure 220. The conductive pads 230 may be or include a plurality of under-ball metallurgy (UBM) patterns 230a for mounting of conductive terminals and a plurality of connection pads 230b for mounting of passive components. The conductive pads 230 are electrically connected to the topmost redistribution conductive layer 224 in the front-side redistribution circuit structure 220. In other words, the conductive pads 230 are electrically connected to the conductive pillars 150 of the semiconductor die 200 and the conductive through vias TV through the front-side redistribution circuit structure 220. It is noted that the number of the UBM patterns 230a and the number of the connection pads 230b are not limited in this disclosure.

Figure 11:
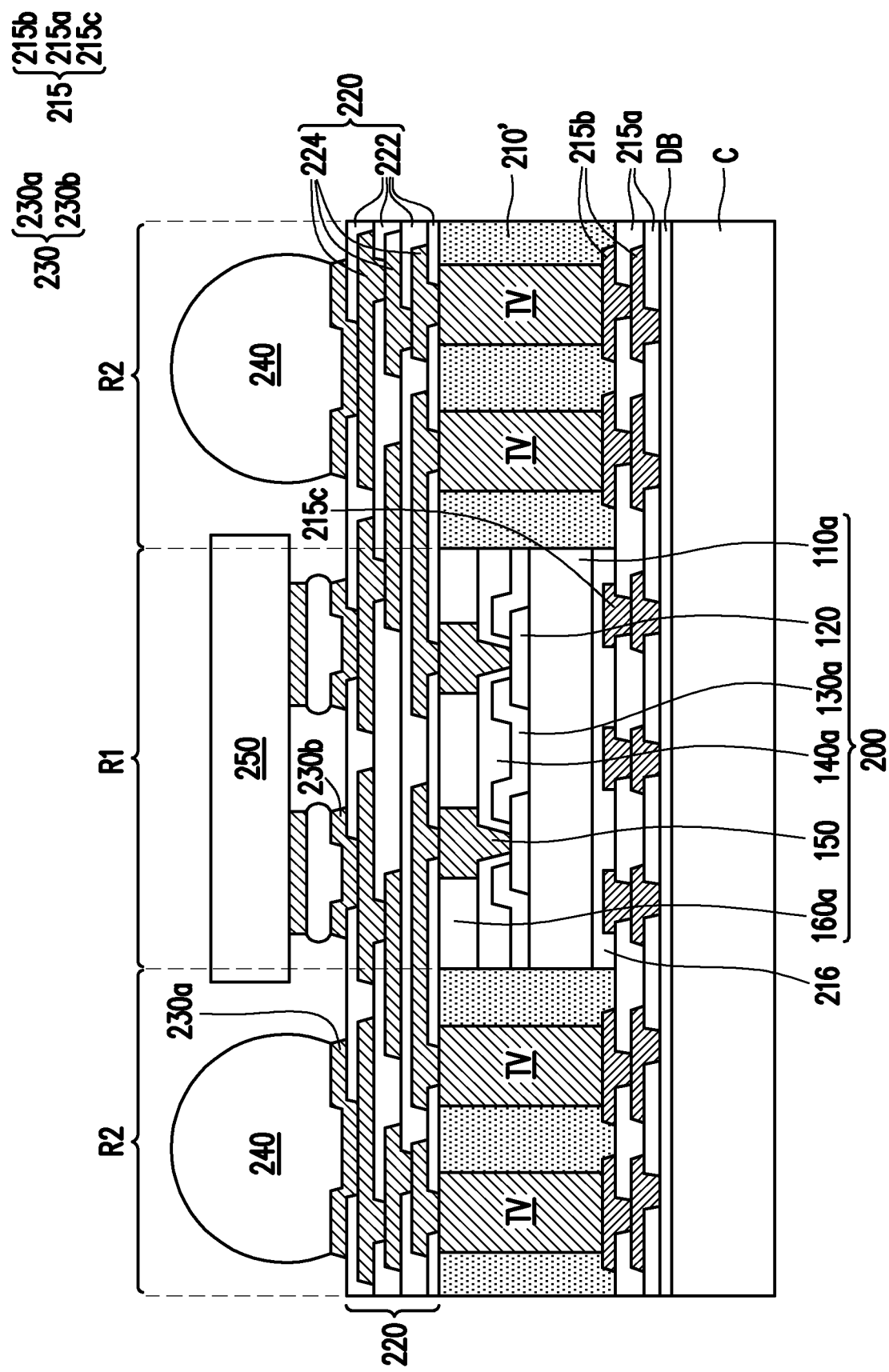

Referring to FIG. 11, after the UBM patterns 230a and the connection pads 230b are formed, a plurality of conductive terminals 240 and a plurality of passive components 250 are provided. The conductive terminals 240 are placed over the under-ball metallurgy patterns 230a, and the passive components 250 are mounted over the connection pads 230b. The conductive terminals 240 may be or include conductive balls (e.g., solder balls). In some embodiments, the conductive terminals 240 may be placed on the under-ball metallurgy patterns 230a through a ball placement process. The conductive terminals 240 and the passive components 250 may be mounted on and electrically connected to the connection pads 230b through a reflow process. In some embodiments, the height of the conductive terminals 240 is greater than the height of the passive components 250.

Figure 12:
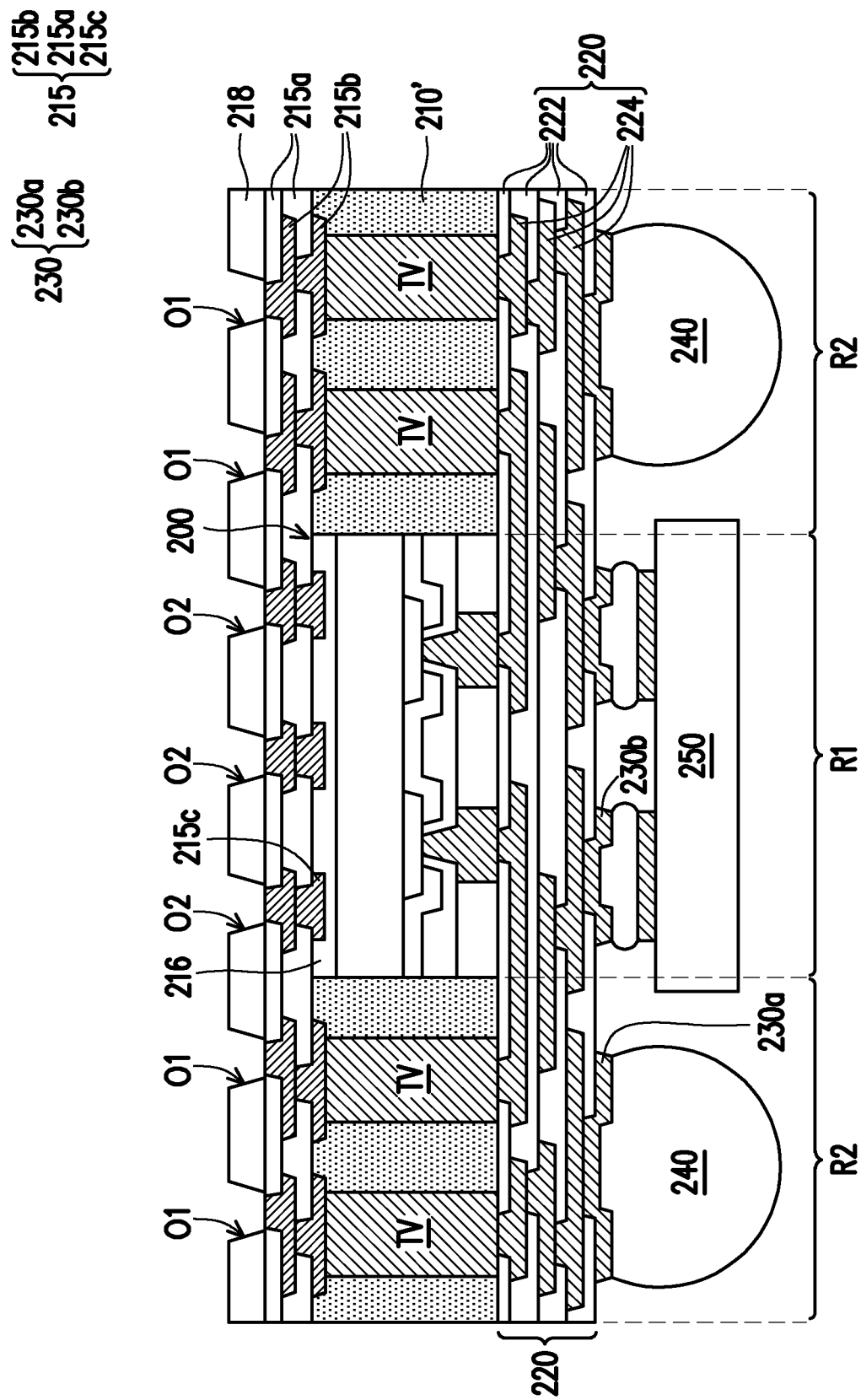

Referring to FIG. 11 and FIG. 12, after the conductive terminals 240 and the passive components 250 are mounted on the pads 230, the back-side redistribution circuit structure 215 formed on the bottom surface of the insulating encapsulation 210' is de-bonded from the de-bonding layer DB such the back-side redistribution circuit structure 215 is separated from the carrier C. The bottommost inter-dielectric layer 215a is revealed after performing the de-bonding process. In some embodiments, the de-bonding layer DB (e.g., the LTHC release layer) may be irradiated by an UV laser such that the back-side redistribution circuit structure 215 is peeled from the carrier C.

As shown in FIG. 12, after performing the de-bonding process, a backside dielectric layer 218 may be formed to cover the revealed surface of the back-side redistribution circuit structure 215. The backside dielectric layer 218 may be a dielectric layer for marking and warpage control. The backside dielectric layer 218 may reduce warpage of the resulted structure illustrated in FIG. 12 and provide marking recognition. In other words, product marking may be formed on the surface of the backside dielectric layer 218 through a laser marking process. The backside dielectric layer 218 may be formed through lamination process followed by curing process. In some embodiments, the material of the backside dielectric layer 218 includes acrylic ester polymer, epoxy resin, silica, carbon black, and additives. The thickness of the backside dielectric layer 218 may range from about 10 micrometers to about 100 micrometers. The backside dielectric layer 218 and the bottommost inter-dielectric layer 215a are then patterned such that contact openings O1 and contact openings O2 are formed to reveal the bottom surfaces of the bottommost redistribution conductive layer 215b. The contact openings O2 are distributed above the die-bond region R1 and the contact openings O1 are distributed above the periphery region R2, as shown in FIG. 18. The backside dielectric layer 218 and the bottommost inter-dielectric layer 215a may be patterned through a laser drilling process or other suitable patterning process. The contact openings O1 are located above the semiconductor die 200, and the contact openings O2 are located above the conductive through vias TV. The number and the position of the contact openings O1 and the contact openings O2 are not limited in the present invention. In some embodiments, the contact openings O1 and the contact openings O2 are formed by an etch process, a laser drilling process, combinations thereof, or other suitable patterning process.

Figure 13:
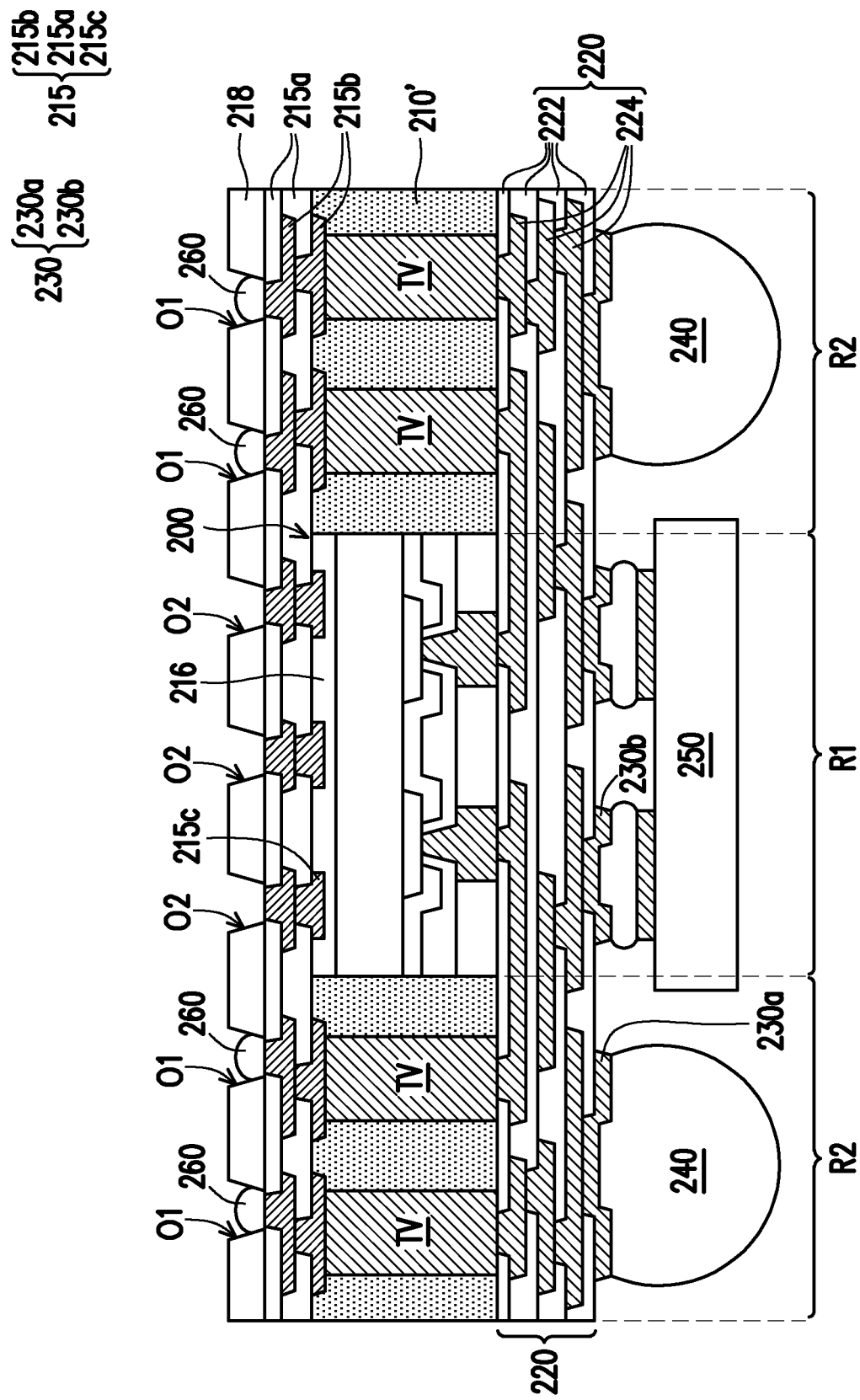
Figure 14:
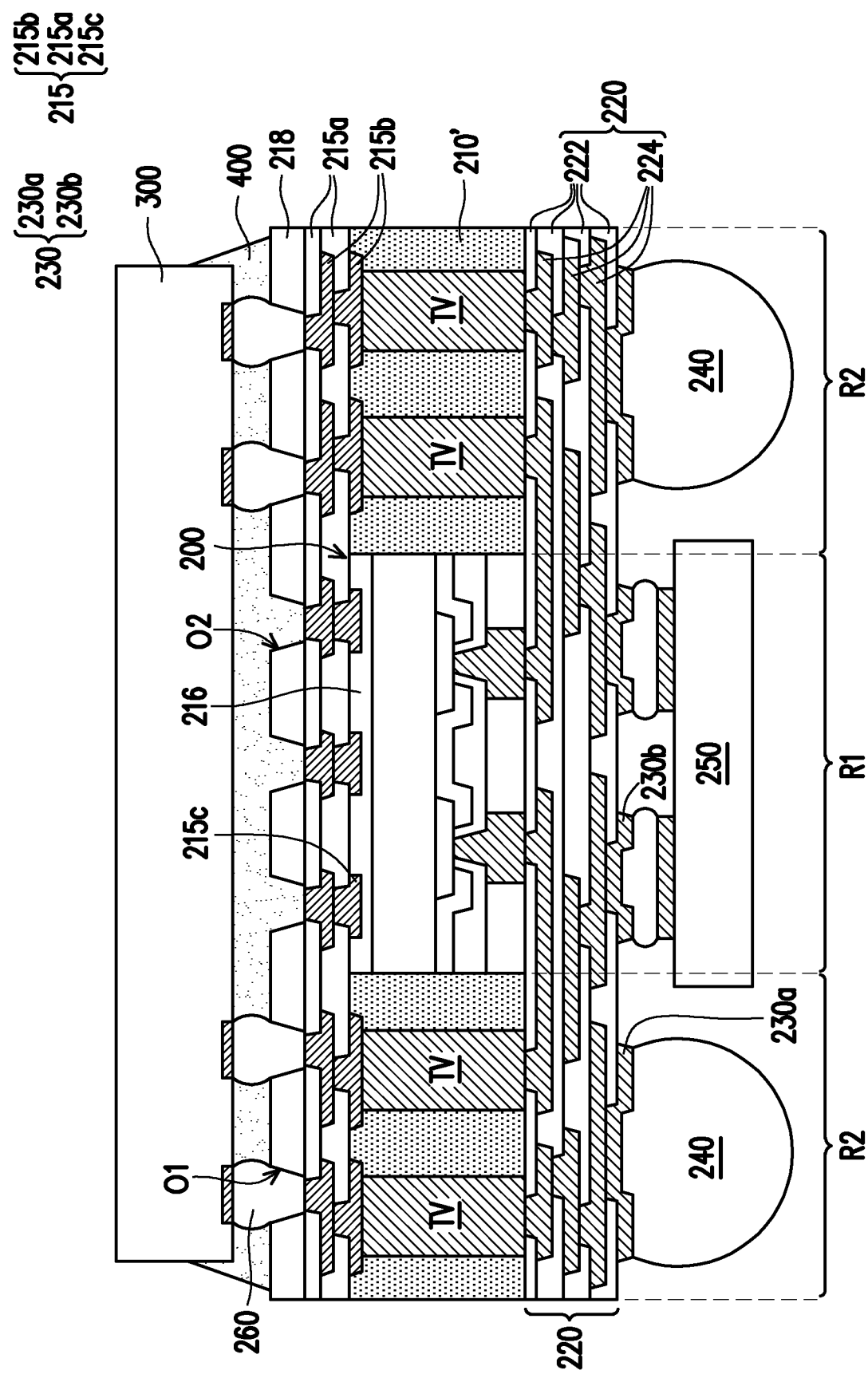
FIG. 14 is a cross-sectional view schematically illustrating a package-on-package (PoP) structure in accordance with some embodiments.

Referring to FIG. 13, after the contact openings O1 and the contact openings O2 are formed in the backside dielectric layer 218, a pre-solder process is performed. During the pre-solder process, solder material 217 may be provided and applied onto the revealed surfaces of the bottommost redistribution conductive layer 215b. In other words, the solder material 217 is merely applied onto the revealed surfaces of the bottommost redistribution conductive layer 215b, but the solder material 217 is not applied onto the revealed surface of the thermal enhancement structures 215c.

Referring to FIG. 14, an electronic device (i.e., a package) 300 including conductive terminals 260 formed thereon is then provided. The conductive terminals 260 may be or include conductive bumps (e.g., copper bumps, solder bumps or the like). The electronic device 300 is stacked over and electrically connected to the integrated fan-out package illustrated in FIG. 12. In some embodiments, the electronic device 300 is electrically connected to the integrated fan-out package illustrated in FIG. 12 by performing a reflow process. After the electronic device 300 is mounted onto and electrically connected to the integrated fan-out package illustrated in FIG. 12, a package-on-package (PoP) structure is fabricated. During the reflow process, mutual fusion between the solder material 217 and the conductive terminals 260 occurs and re-shaped conductive terminals 260 are then formed between the electronic device 300 and the integrated fan-out package illustrated in FIG. 12. The electronic device 300 may be or include a memory device, such as a dynamic random access memory (DRAM) device, an static random access memory (SRAM) device, a high bandwidth memory (HBM) device or other suitable types of memory device. The conductive terminals 260 are reflowed to bond with the surfaces of the bottommost redistribution conductive layer 215b revealed by the contact openings O1 defined in the backside dielectric layer 218. The conductive terminals 260 are not disposed in the contact openings O2, and the surfaces of the thermal enhancement structures 215c are revealed by the contact openings O2.

As shown in FIG. 14, after the conductive terminals 240 and the conductive terminals 260 are formed, an integrated fan-out package of the semiconductor die 200 having dual-side terminal design (i.e., the conductive terminals 240 and the conductive terminals 260) is fabricated.

An underfill 400 is then formed to fill the gap between the backside dielectric layer 218 and the electronic device 300. The underfill 400 fills the contact openings O2 and is in contact with the thermal enhancement structures 215c revealed from the contact openings O2. The underfill 400 penetrates through the backside dielectric layer 218 and is in contact with the thermal enhancement structures 215c. In some embodiments, the thermal conductivity of the underfill 400 ranges from about 0.1 W/(m·K) to about 5 W/(m·K). The material of the underfill 400 may be or include epoxy resin with filler distributed therein. Portions of the underfill 400 located in the contact openings O2 may provide heat dissipation path for the semiconductor die 200. The portions of the underfill 400 located in the contact openings O2 may be referred as to thermal enhancement medium for enhancing the heat dissipation performance.

Figure 15:
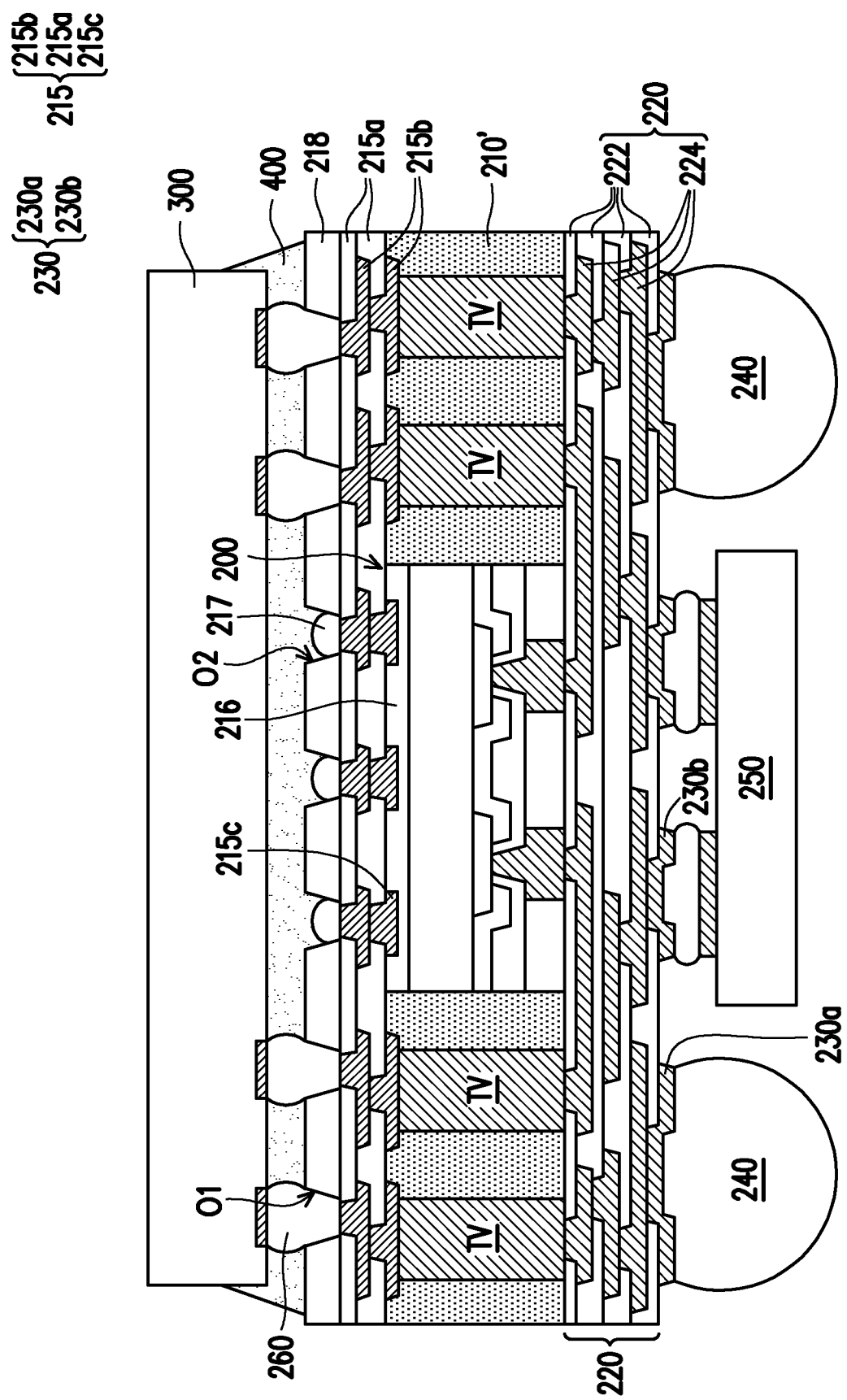
FIG. 15 is a cross-sectional view schematically illustrating a package-on-package (PoP) structure in accordance with some other embodiments.

FIG. 15 is a cross-sectional view schematically illustrating a package-on-package (PoP) structure in accordance with some other embodiments.

Referring to FIG. 15, not only the solder material 217 is applied onto the surfaces of the bottommost redistribution conductive layer 215b revealed by the contact openings O1, but also the solder material 217 is applied onto the surfaces of the thermal enhancement structures 215c revealed by the contact openings O2. The thermal enhancement structures 215c are thermally coupled to the back surface of the semiconductor die 200. In other words, the contact openings O1 and the contact openings O2 are partially filled by the solder material 217, and the surfaces of the thermal enhancement structures 215c are covered by the solder material 217. Furthermore, the underfill 400 fills the contact openings O2 and is in contact with the solder material 217 located in the contact openings O2. In some other embodiments, the solder material 217 entirely fills the contact openings O2 and is in contact with the overlying underfill 400. That is, the contact openings O2 are merely filled by the solder material 217, and the underfill 400 does not distributed in the contact openings O2.

Portions of the underfill 400 and the solder material 217 located in the contact openings O2 may provide heat dissipation path for the semiconductor die 200. The portions of the underfill 400 and the solder material 217 located in the contact openings O2 may be referred as to thermal enhancement medium for enhancing the heat dissipation performance.

Figure 16:
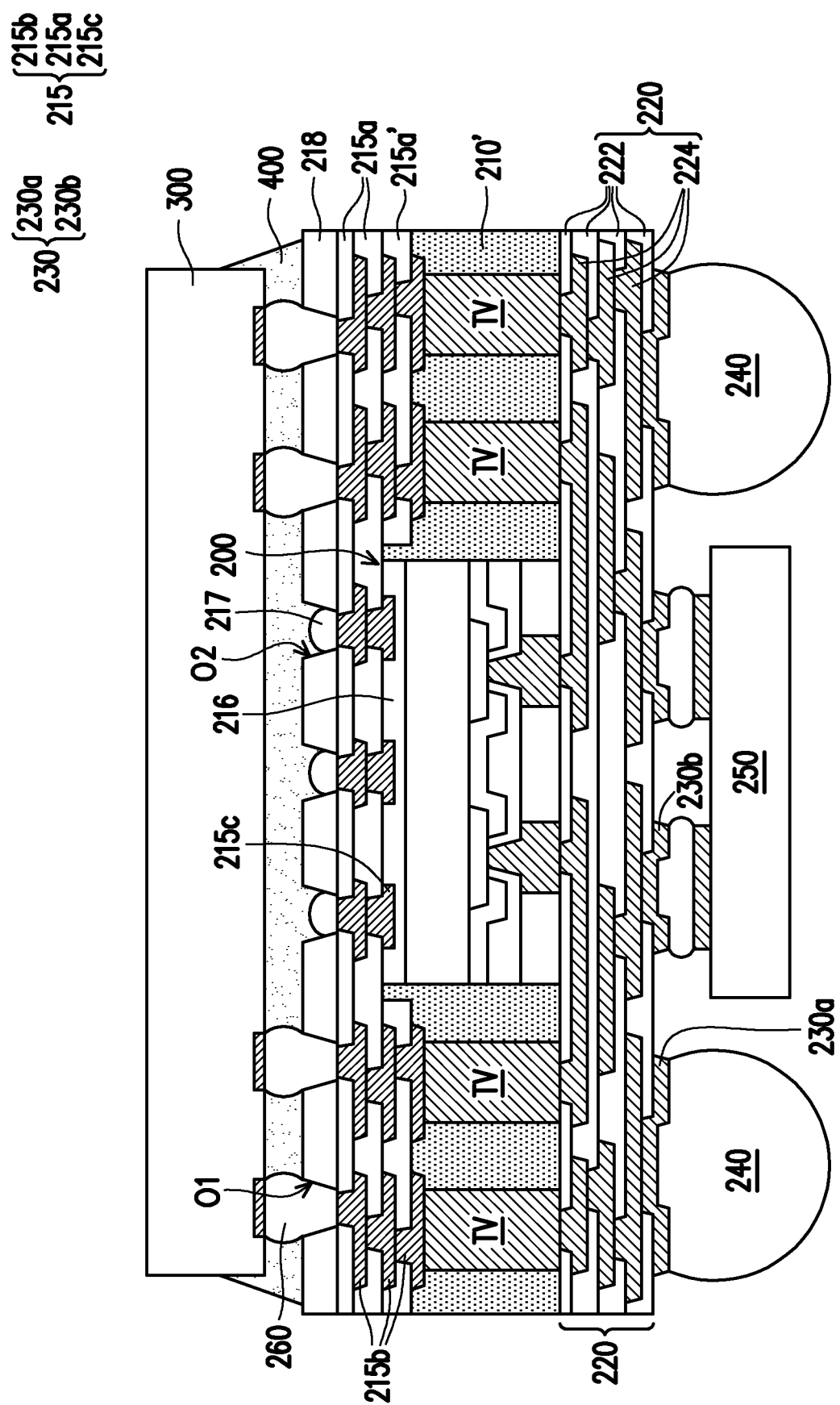
FIG. 16 is a cross-sectional view schematically illustrating a package-on-package (PoP) structure in accordance with some another embodiment.

FIG. 16 is a cross-sectional view schematically illustrating a package-on-package (PoP) structure in accordance with some another embodiment.

Referring to FIG. 15 and FIG. 16, the PoP structure illustrated in FIG. 16 is similar to the PoP structure illustrated in FIG. 15 except that the redistribution circuit structure 215 illustrated in FIG. 16 further includes an inter-dielectric layer 215a'. The die attachment film (DAF) 216 may be disposed in an opening defined in the inter-dielectric layer 215a', and the die attachment film (DAF) 216 may be spaced apart from the inter-dielectric layer 215a' by the insulating encapsulation 210'.

Figure 17:
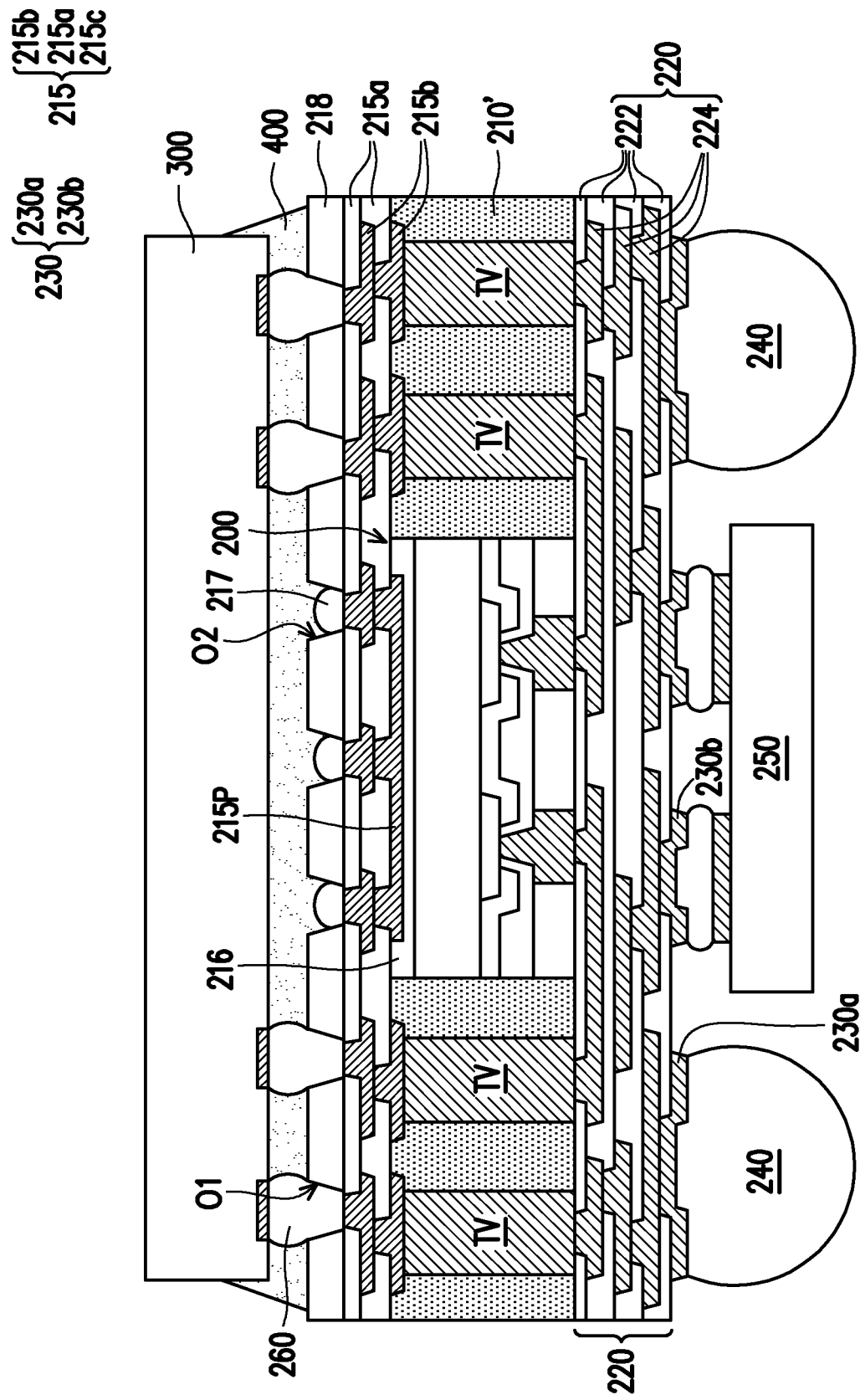
FIG. 17 is a cross-sectional view schematically illustrating a package-on-package (PoP) structure in accordance with some alternative embodiments.

FIG. 17 is a cross-sectional view schematically illustrating a package-on-package (PoP) structure in accordance with some alternative embodiments.

Referring to FIG. 15 and FIG. 17, the PoP structure illustrated in FIG. 17 is similar to the PoP structure illustrated in FIG. 15 except that the redistribution circuit structure 215c share a thermal pad 215P, and the die attachment film (DAF) 216 is disposed on the thermal pad 215P. In some embodiments, the lateral dimension of the die attachment film (DAF) 216 is slightly smaller than the lateral dimension of the thermal pad 215P. The die attachment film (DAF) 216 may be spaced apart from the inter-dielectric layer 215a by the thermal pad 215P.

In accordance with some embodiments of the present disclosure, a package structure including a semiconductor die, a redistribution circuit structure, a backside dielectric layer, conductive terminals, an electronic device, and an underfill is provided. The semiconductor die laterally encapsulated by an insulating encapsulation. The redistribution circuit structure is disposed on the semiconductor die and the insulating encapsulation. The redistribution circuit structure includes redistribution conductive layers and thermal enhancement structures electrically insulated from the redistribution conductive layers, and the thermal enhancement structures are thermally coupled to the semiconductor die. The backside dielectric layer is disposed on the redistribution circuit structure. The conductive terminals penetrate through the backside dielectric layer. The electronic device is disposed over the backside dielectric layer and electrically connected to the redistribution circuit structure through the conductive terminals. The underfill is disposed between the backside dielectric layer and the electronic device, wherein the underfill is thermally coupled to the thermal enhancement structures. In some embodiments, the redistribution circuit structure further comprising inter-dielectric layers, and the redistribution conductive layers are embedded in the inter-dielectric layers. In some embodiments, the thermal enhancement structures are electrically floated. In some embodiments, the thermal enhancement structures comprise stacked thermal pads and at least one thermal via thermally coupled between the stacked thermal pads. In some embodiments, the package structure further includes solder material disposed between the underfill and the thermal enhancement structures. In some embodiments, the underfill is spaced apart from the thermal enhancement structures by the solder material. In some embodiments, the underfill penetrates through the backside dielectric layer and is in contact with the thermal enhancement structures. In some embodiments, the underfill laterally encapsulate the conductive terminals.

In accordance with some other embodiments of the present disclosure, a package structure including a semiconductor die, an insulating encapsulation, a redistribution circuit structure, a backside dielectric layer, conductive terminals, an electronic device, and an underfill is provided. The insulating encapsulation laterally encapsulates the semiconductor die. The redistribution circuit structure is disposed on the semiconductor die and the insulating encapsulation. The redistribution circuit structure includes redistribution conductive layers and thermal enhancement structures, and the thermal enhancement structures are thermally coupled to the semiconductor die. The backside dielectric layer is disposed on the redistribution circuit structure, and the backside dielectric layer includes first openings and second openings. The conductive terminals are disposed in the first openings. The electronic device is disposed over the backside dielectric layer and electrically connected to the redistribution circuit structure through the conductive terminals. The underfill is disposed between the backside dielectric layer and the electronic device. The underfill fills the second openings and is thermally coupled to the thermal enhancement structures. In some embodiments, the redistribution circuit structure further comprising inter-dielectric layers, and the redistribution conductive layers are embedded in the inter-dielectric layers. In some embodiments, the thermal enhancement structures are electrically insulated from the redistribution conductive layers. In some embodiments, the thermal enhancement structures are electrically floated. In some embodiments, the package structure further includes solder material located in the second openings, wherein the underfill is in contact with the solder material. In some embodiments, the underfill is spaced apart from the thermal enhancement structures by the solder material. In some embodiments, the underfill laterally encapsulate the conductive terminals.

In accordance with some alternative embodiments of the present disclosure, a package structure including a semiconductor die laterally encapsulated by an insulating encapsulation, a redistribution circuit structure disposed on the semiconductor die and the insulating encapsulation, conductive terminals, an electronic device, and an underfill is provided. The redistribution circuit structure includes a die-bond region and a periphery region surrounding the die-bond region. The die-bond region includes thermal enhancement structures, the periphery region includes redistribution conductive layers, and the thermal enhancement structures are thermally coupled to the semiconductor die. The electronic device is stacked over the redistribution circuit structure. The electronic device is electrically connected to the redistribution circuit structure through the conductive terminals. The underfill is disposed between the redistribution circuit structure and the electronic device, wherein the underfill is thermally coupled to the thermal enhancement structures. In some embodiments, the thermal enhancement structures are electrically insulated from the redistribution conductive layers. In some embodiments, the thermal enhancement structures are electrically floated. In some embodiments, the package structure further includes a backside dielectric layer disposed on the redistribution circuit structure, wherein the backside dielectric layer comprises openings corresponding to the thermal enhancement structures. In some embodiments, the package structure further includes solder material disposed in the openings, wherein the solder material is in contact with the underfill and the thermal enhancement structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor die laterally encapsulated by an insulating encapsulation;
a redistribution circuit structure disposed on the semiconductor die and the insulating encapsulation, the redistribution circuit structure comprising redistribution conductive layers and thermal enhancement structures electrically insulated from the redistribution conductive layers, and the thermal enhancement structures being thermally coupled to the semiconductor die;
a backside dielectric layer disposed on the redistribution circuit structure;
conductive terminals penetrating through the backside dielectric layer;
an electronic device disposed over the backside dielectric layer and electrically connected to the redistribution circuit structure through the conductive terminals; and
an underfill disposed between the backside dielectric layer and the electronic device, wherein the underfill is thermally coupled to the thermal enhancement structures.

2. The package structure of claim 1, wherein the redistribution circuit structure further comprising inter-dielectric layers, and the redistribution conductive layers are embedded in the inter-dielectric layers.

3. The package structure of claim 1, wherein the thermal enhancement structures are electrically floated.

4. The package structure of claim 1, wherein the thermal enhancement structures comprise stacked thermal pads and at least one thermal via thermally coupled between the stacked thermal pads.

5. The package structure of claim 1 further comprising solder material disposed between the underfill and the thermal enhancement structures.

6. The package structure of claim 5, wherein the underfill is spaced apart from the thermal enhancement structures by the solder material.

7. The package structure of claim 1, wherein the underfill penetrates through the backside dielectric layer and is in contact with the thermal enhancement structures.

8. The package structure of claim 1, wherein the underfill laterally encapsulate the conductive terminals.

9. A package structure, comprising:
a semiconductor die;
an insulating encapsulation laterally encapsulating the semiconductor die;
a redistribution circuit structure disposed on the semiconductor die and the insulating encapsulation, the redistribution circuit structure comprising redistribution conductive layers and thermal enhancement structures, and the thermal enhancement structures being thermally coupled to the semiconductor die;
a backside dielectric layer disposed on the redistribution circuit structure, the backside dielectric layer comprising first openings and second openings;
conductive terminals disposed in the first openings;
an electronic device disposed over the backside dielectric layer and electrically connected to the redistribution circuit structure through the conductive terminals; and
an underfill disposed between the backside dielectric layer and the electronic device, the underfill filling the second openings and being thermally coupled to the thermal enhancement structures.

10. The package structure of claim 9, wherein the redistribution circuit structure further comprising inter-dielectric layers, and the redistribution conductive layers are embedded in the inter-dielectric layers.

11. The package structure of claim 9, wherein the thermal enhancement structures are electrically insulated from the redistribution conductive layers.

12. The package structure of claim 9, wherein the thermal enhancement structures are electrically floated.

13. The package structure of claim 9 further comprising solder material located in the second openings, wherein the underfill is in contact with the solder material.

14. The package structure of claim 13, wherein the underfill is spaced apart from the thermal enhancement structures by the solder material.

15. The package structure of claim 9, wherein the underfill laterally encapsulate the conductive terminals.

16. A package structure, comprising:
a semiconductor die laterally encapsulated by an insulating encapsulation;
a redistribution circuit structure disposed on the semiconductor die and the insulating encapsulation, the redistribution circuit structure comprising a die-bond region and a periphery region surrounding the die-bond region, the die-bond region comprising thermal enhancement structures, the periphery region comprising redistribution conductive layers, and the thermal enhancement structures being thermally coupled to the semiconductor die;
conductive terminals;
an electronic device stacked over the redistribution circuit structure, the electronic device being electrically connected to the redistribution circuit structure through the conductive terminals; and an underfill disposed between the redistribution circuit structure and the electronic device, wherein the underfill is thermally coupled to the thermal enhancement structures.

17. The package structure of claim 16, wherein the thermal enhancement structures are electrically insulated from the redistribution conductive layers.

18. The package structure of claim 16, wherein the thermal enhancement structures are electrically floated.

19. The package structure of claim 16 further comprising a backside dielectric layer disposed on the redistribution circuit structure, wherein the backside dielectric layer comprises openings corresponding to the thermal enhancement structures.

20. The package structure of claim 19 further comprising solder material disposed in the openings, wherein the solder material is in contact with the underfill and the thermal enhancement structures.

\* \* \* \* \*